(12) United States Patent
Li et al.

(10) Patent No.: US 10,553,815 B2
(45) Date of Patent: Feb. 4, 2020

(54) ORGANIC LIGHT EMISSION DISPLAY DEVICE AND ENCAPSULATION METHOD THEREFOR

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fashun Li, Beijing (CN); Ang Xiao, Beijing (CN); Lina Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/571,401

(22) PCT Filed: Jun. 8, 2017

(86) PCT No.: PCT/CN2017/087514
§ 371 (c)(1),
(2) Date: Nov. 2, 2017

(87) PCT Pub. No.: WO2018/001060
PCT Pub. Date: Jan. 4, 2018

(65) Prior Publication Data
US 2018/0226607 A1    Aug. 9, 2018

(30) Foreign Application Priority Data
Jun. 28, 2016   (CN) .......................... 2016 1 0491246

(51) Int. Cl.
H01L 51/52    (2006.01)
H01L 51/56    (2006.01)
H01L 27/32    (2006.01)

(52) U.S. Cl.
CPC .......... *H01L 51/5246* (2013.01); *H01L 27/32* (2013.01); *H01L 51/5253* (2013.01); *H01L 51/56* (2013.01); *H01L 2251/50* (2013.01)

(58) Field of Classification Search
None
See application file for complete search history.

(56) References Cited

U.S. PATENT DOCUMENTS 7,508,063 B2   3/2009   Duboc et al.
7,907,329 B2   3/2011   Lee et al.
(Continued)

FOREIGN PATENT DOCUMENTS

CN    101419375 A    4/2009
CN    101572253 A    11/2009
(Continued)

OTHER PUBLICATIONS

The First Chinese Office Action dated May 3, 2017; Appln. No. 201610491246.2.
(Continued)

*Primary Examiner* — Walter H Swanson
*Assistant Examiner* — Kien C Ly
(74) *Attorney, Agent, or Firm* — Ladas & Parry LLP

(57) ABSTRACT

An organic light emission display device and an encapsulation method therefor are provided. The organic light emission display device includes a base substrate, and an organic light emission diode, a barrier layer and an organic thin film encapsulation layer which are disposed on the base substrate. The organic light emission display device further includes a detection layer disposed on the base substrate;
(Continued)

and the detection layer is configured to contact with the organic thin film encapsulation layer and make a change in the case that the organic thin film encapsulation layer overflows the barrier layer.

20 Claims, 5 Drawing Sheets

(56) References Cited

U.S. PATENT DOCUMENTS

| | | | |
|---|---|---|---|
| 2008/0036367 A1* | 2/2008 | Eida | H01L 27/322 |
| | | | 313/504 |
| 2009/0109520 A1 | 4/2009 | Park et al. | |
| 2013/0161680 A1 | 6/2013 | Oh et al. | |
| 2014/0353042 A1* | 12/2014 | Karale | C09K 8/04 |
| | | | 175/64 |
| 2017/0062534 A1 | 3/2017 | Jiang et al. | |
| 2017/0222173 A1* | 8/2017 | Matsusue | H01L 51/5044 |
| 2017/0250365 A1 | 8/2017 | Jin et al. | |
| 2018/0061722 A1* | 3/2018 | Byun | H01L 51/0031 |

FOREIGN PATENT DOCUMENTS

| | | |
|---|---|---|
| CN | 101762925 A | 6/2010 |
| CN | 103178078 A | 6/2013 |
| CN | 105261712 A | 1/2016 |
| CN | 105355645 A | 2/2016 |
| CN | 105489786 A | 4/2016 |
| CN | 105895827 A | 8/2016 |
| JP | 2007-025189 A | 2/2007 |
| JP | 2015-076195 A | 4/2015 |

OTHER PUBLICATIONS

International Search Report and Written Opinion dated Aug. 18, 2017; PCT/CN2017/087514.

* cited by examiner (a)

(b)

ORGANIC LIGHT EMISSION DISPLAY DEVICE AND ENCAPSULATION METHOD THEREFOR

TECHNICAL FIELD

Embodiments of the present disclosure relate to an organic light emission display device and an encapsulation method therefor.

BACKGROUND

Organic light emission diode (OLED) display device has become a very important display technology in the field of flat panel display, due to its advantages of small thickness, light weight, wide viewing angle, good capability of actively emitting light, continuous and adjustable wavelength of the emitted light, low cost, fast response speed, small energy consumption, wide range of working temperature, simple production process, high light emission efficiency, flexible display, and the like.

Components such as water vapor and oxygen in the air have very large influence on the service life of an OLED in the OLED display device. A cathode of the OLED is generally formed by a metal material such as aluminum, magnesium, calcium, etc., and such metal material has relatively active chemical properties and very easily reacts with the water vapor and oxygen. In addition, the water vapor and oxygen easily has a chemical reaction with an organic light emission layer of the OLED. The above reactions cause a failure of the OLED. Therefore, the OLED display device needs to be effectively encapsulated, such that respective functional layers of the OLED are fully separated from the components such as water vapor and oxygen in the air.

Encapsulation methods for the OLED display device generally include two types of substrate encapsulation and thin film encapsulation (TFE). The substrate encapsulation refers to that an adhesive is filled between a display substrate having the OLED and an encapsulation substrate, an airtight space is formed between the display substrate and the encapsulation substrate after the adhesive is cured, and thereby the encapsulation effect is achieved. The thin film encapsulation refers to that an organic thin film encapsulation layer covers the surface of the OLED, such that it is difficult for the water vapor and oxygen to enter the OLED.

SUMMARY

According to embodiments of the disclosure, an organic light emission display device is provided. The organic light emission display device comprises a base substrate, and an organic light emission diode, a barrier layer and an organic thin film encapsulation layer which are disposed on the base substrate. The organic light emission display device further comprises a detection layer disposed on the base substrate; and the detection layer is configured to contact with the organic thin film encapsulation layer and make a change in the case that the organic thin film encapsulation layer overflows the barrier layer.

For example, the detection layer is a layer which makes the change visible to human eyes once it makes contact with the organic thin film encapsulation layer.

For example, the detection layer is a layer which makes a color change once it contacts with the organic thin film encapsulation layer.

For example, a material of the detection layer is ferric chloride.

For example, the organic light emission display device further comprises a first inorganic thin film encapsulation layer located below the organic thin film encapsulation layer and a second inorganic thin film encapsulation layer located above the organic thin film encapsulation layer, and the detection layer is located between the first inorganic thin film encapsulation layer and the second inorganic thin film encapsulation layer.

For example, the detection layer is directly located on the base substrate.

For example, the barrier layer surrounds the organic light emission diode, and the organic thin film encapsulation layer covers the organic light emission diode; the detection layer is disposed on a side of the barrier layer away from the organic light emission diode; and the detection layer is disposed to be a continuous or discontinuous layer.

For example, the organic light emission display device comprises a display region and a non-display region surrounding the display region, the organic light emission diode is disposed in the display region, and the barrier layer and detection layer are disposed in the non-display region.

For example, the base substrate is a glass substrate or flexible substrate.

According to the embodiments of the disclosure, an encapsulation method for an organic light emission display device is provided. The method comprises: forming an organic light emission diode and a barrier layer on a base substrate; forming a detection layer on the base substrate; and forming an organic thin film encapsulation layer on the base substrate, and the detection layer is configured to contact with the organic thin film encapsulation layer and make a change in the case that the organic thin film encapsulation layer overflows the barrier layer.

For example, the forming the detection layer on the base substrate includes: forming the detection layer on the base substrate by a coating method.

For example, before forming the detection layer on the base substrate, the method further comprises: forming a first inorganic thin film encapsulation layer covering an entirety of the base substrate on the base substrate.

For example, after forming the organic thin film encapsulation layer on the base substrate, the method further comprises: forming a second inorganic thin film encapsulation layer covering an entirety of the base substrate on the organic thin film encapsulation layer.

For example, the detection layer is a layer which makes the change visible to human eyes once it makes contact with the organic thin film encapsulation layer.

For example, the detection layer is a layer which makes a color change once it contacts with the organic thin film encapsulation layer.

For example, a material of the detection layer is ferric chloride.

For example, the detection layer is directly located on the base substrate.

For example, the barrier layer surrounds the organic light emission diode, and the organic thin film encapsulation layer covers the organic light emission diode; the detection layer is disposed on a side of the barrier layer away from the organic light emission diode; and the detection layer is disposed to be a continuous or discontinuous layer.

For example, the organic light emission display device comprises a display region and a non-display region surrounding the display region, the organic light emission diode is disposed in the display region, and the barrier layer and detection layer are disposed in the non-display region.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "connect" or "interconnect" and the like are not limited to physical or mechanical connections, but may include electrical connections, whether direct or indirect. Expressions such as "up", "down", "left", "right" and the like are only used for expressing relative positional relationship, the relative positional relationship may be correspondingly changed in the case that the absolute position of a described object is changed.

It should be noted that the thicknesses, sizes and shapes of respective layers do not reflect a true proportion of the respective layers, and merely are intended to schematically explain the embodiments of the present disclosure.

Figure 1:
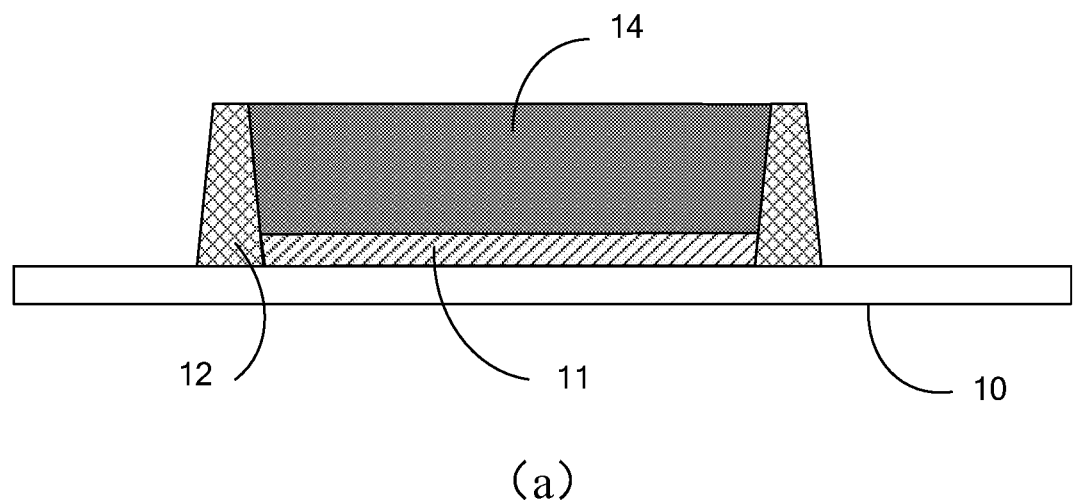
FIGS. 1(a) and 1(b) are structural schematic diagrams of an organic light emission display device according to a technology.
Figure 1:
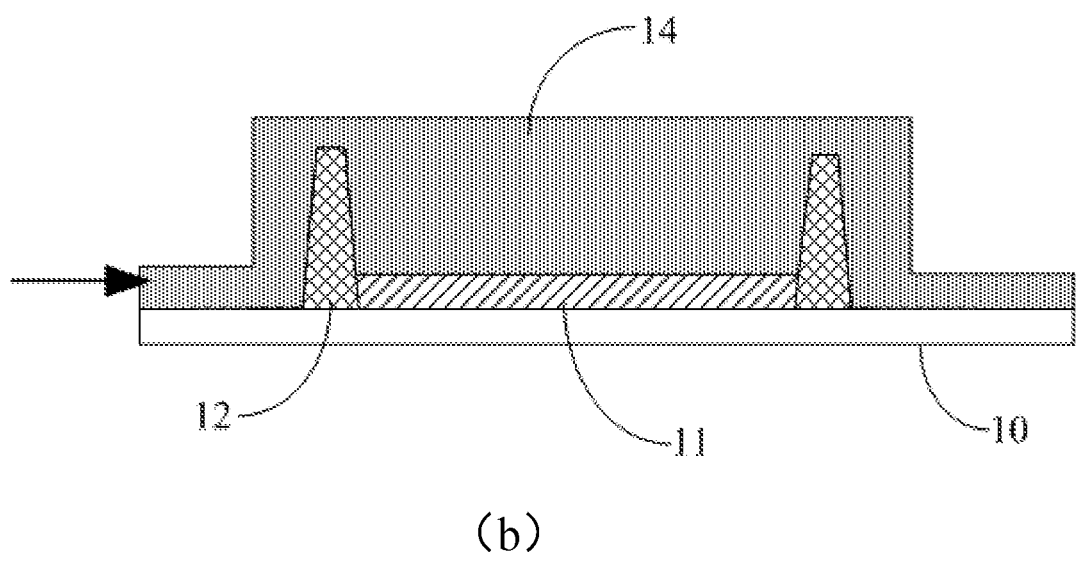

Encapsulation methods for an OLED display device generally include two types of substrate encapsulation and thin film encapsulation. For example, the thin film encapsulation refers to that an organic thin film encapsulation layer covers a surface of an OLED of the OLED display device, such that it is difficult for water and oxygen to enter the OLED. However, in the situation of adopting the thin film encapsulation, the outside water and oxygen still possibly enter into the encapsulated OLED from a side surface of the organic thin film encapsulation layer. In order to solve this problem, a barrier layer for example is disposed. As shown in FIG. 1(a), the barrier layer 12 is formed on a base substrate 10, and the barrier layer 12 is in contact with the side surface of the organic thin film encapsulation layer 14, so as to obstruct the side surface of the organic thin film encapsulation layer 14 from contacting with the outside water content and oxygen.

However, in an practical production process, before the organic thin film encapsulation layer 14 is not cured, the colloidal organic thin film encapsulation layer 14 may overflow the barrier layer 12, as shown in FIG. 1(b), in this case, the outside water and oxygen still have a chance to enter the OLED 11 from a side surface of the organic thin film encapsulation layer 14 (as shown by an arrow direction in the drawing), thus a damage to the OLED 11 is caused.

Figure 2:
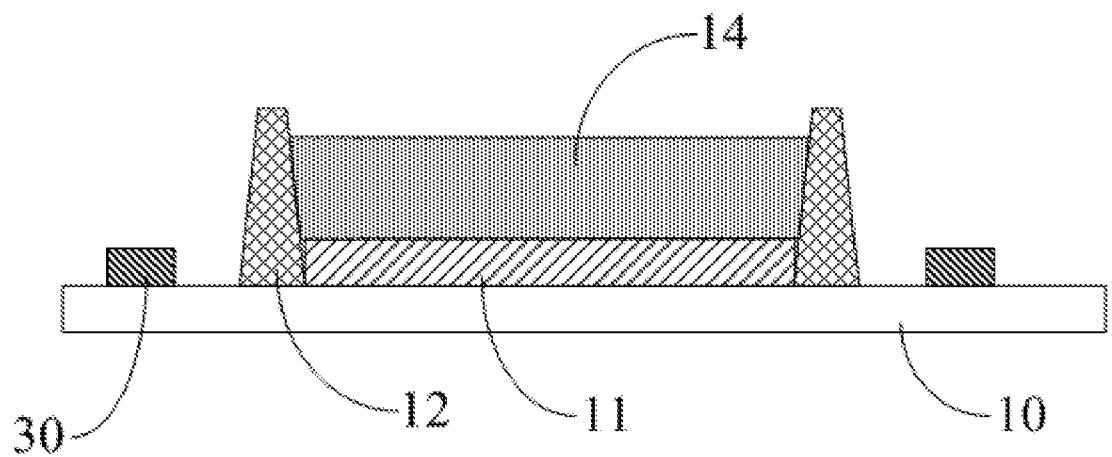
FIG. 2 is a structural schematic diagram of an organic light emission display device provided by an embodiment of the present disclosure.

As shown in FIG. 2, the embodiments of the present disclosure provide an organic light emission display device, and the organic light emission display device comprises a base substrate 10, and an organic light emission diode 11, a barrier layer 12 and an organic thin film encapsulation layer 14 which are disposed on the base substrate 10. The organic light emission display device provided by the embodiments of the present disclosure further comprises a detection layer 30 disposed on the base substrate 10, and the detection layer 30 is located in an edge region of the base substrate 10 and is configured to contact with the organic thin film encapsulation layer 14 and make a change in the case that the organic thin film encapsulation layer 14 overflows the barrier layer 12.

For example, the detection layer 30 is a layer which makes the change visible to human eyes once it makes contact with the organic thin film encapsulation layer 14. It should be noted that the change "visible to human eyes" includes the change that is directly observed by the human eyes without the help of tools and the change that is observed by the human eyes with the help of tools (for example, a magnifier or a microscope); and for example, the change "visible to human eyes" is a color change, a shape change, etc.

For example, the barrier layer 12 is a closed annular structure to surround the organic light emission diode 11. In FIG. 2, for the sake of simplicity, only one organic light emission diode 11 is shown; however, the embodiments of the present disclosure are not limited thereto. For example, the organic light emission display device provided by the embodiments of the present disclosure comprises a plurality of organic light emission diodes 11 disposed in an array; in such situation, the barrier layer 12 surrounds the plurality of organic light emission diodes 11.

For example, the organic thin film encapsulation layer 14 covers the organic light emission diode 11.

For example, the detection layer 30 is disposed on an outer side of the barrier layer 12 (that is, the detection layer 30 is disposed on a side of the barrier layer 12 away from the organic light emission diode 11). For example, the detection layer 30 is disposed to be a continuous layer to totally surround the barrier layer 12; and in such situation, the detection layer 30 for example is formed into a closed annular structure. For example, an overflow quantity of the organic thin film encapsulation layer 14 that overflows the barrier layer 12 is possibly large, and therefore, the detection layer 30 is not necessary to totally surround the barrier layer 12; in such situation, the detection layer 30 is disposed to be a discontinuous layer as long as it is ensured that the overflowed organic thin film encapsulation layer 14 is capable of making contact with the detection layer 30.

For example, the organic light emission display device according to the embodiments of the present disclosure comprises a display region and a non-display region surrounding the display region. For example, the organic light emission diode 11 is disposed in the display region, and the barrier layer 12 and detection layer 30 are disposed in the non-display region.

In the embodiments of the present disclosure, "the detection layer 30 is located on the base substrate 10" refers to that the detection layer 30 is directly located on the base substrate 10 or the detection layer 30 is indirectly located on the base substrate 10; and in a situation that the detection layer 30 is indirectly located on the base substrate 10, other layers are further disposed between the detection layer 30 and the base substrate 10.

For example, the detection layer 30 is formed before the organic thin film encapsulation layer 14 is formed.

Figure 3:
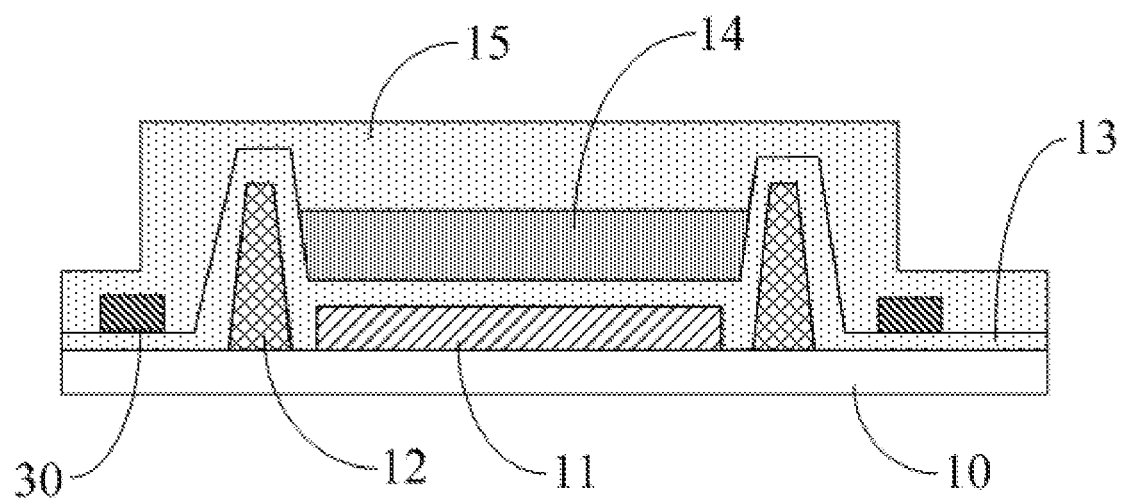
FIG. 3 is a structural schematic diagram of another organic light emission display device provided by an embodiment of the present disclosure.

For example, as shown in FIG. 3, the organic light emission display device of the embodiments of the present disclosure further comprises a first inorganic thin film encapsulation layer 13 and a second inorganic thin film encapsulation layer 15, the detection layer 30 is located between the first inorganic thin film encapsulation layer 13 and the second inorganic thin film encapsulation layer 15, the first inorganic thin film encapsulation layer 13 is located below the organic thin film encapsulation layer 14 and the second inorganic thin film encapsulation layer 15 is located above the organic thin film encapsulation layer 14. The encapsulation effect is further improved by encapsulating the organic light emission diode device 11 using the stack structure of the first inorganic thin film encapsulation layer 13, the organic thin film encapsulation layer 14 and the second inorganic thin film encapsulation layer 15.

For example, the base substrate 10 in the embodiments of the present disclosure is a glass substrate or a flexible substrate. Of course, in a practical production process, the base substrate 10 may be other types of substrates, such as a ceramic substrate, etc., and the embodiments of the present disclosure do not limit a specific material of the base substrate.

For example, the first inorganic thin film encapsulation layer 13 and the second inorganic thin film encapsulation layer 15 are formed by an inorganic material, and the inorganic material is one or a combination of $Al_2O_3$, $TiO_2$, $ZrO_2$, MgO, $HfO_2$, $Ta_2O_5$, $Si_3N_4$, AlN, SiN, SiNO, SiO, $SiO_2$, $SiO_x$, SiC and ITO, but the embodiments of the present disclosure are not limited thereto.

For example, the organic thin film encapsulation layer 14 is formed by an organic material, and the organic material is one or a combination of PET, PEN, PC, PI, PVC, PS, PMMA, PBT, PSO, PES, PE, PP, silicone, PA, PVDF, EVA, EVAL, PAN, PVAc, Parylene, Polyurea, PTFE and epoxy resin, but the embodiments of the present disclosure are not limited thereto.

For example, the detection layer 30 in the embodiments of the present disclosure is a layer which makes a color change once it contacts with the organic thin film encapsulation layer 14. Of course, the detection layer 30 in the embodiments of the present disclosure may be a layer which makes other changes once it contacts with the organic thin film encapsulation layer 14. The embodiment of the present disclosure takes the color change after the detection layer 30 makes contact with the organic thin film encapsulation layer 14 as an example for description, and in this case, a material of the detection layer 30 in the embodiments of the present disclosure for example is ferric chloride ($FeCl_3$).

Figure 4:
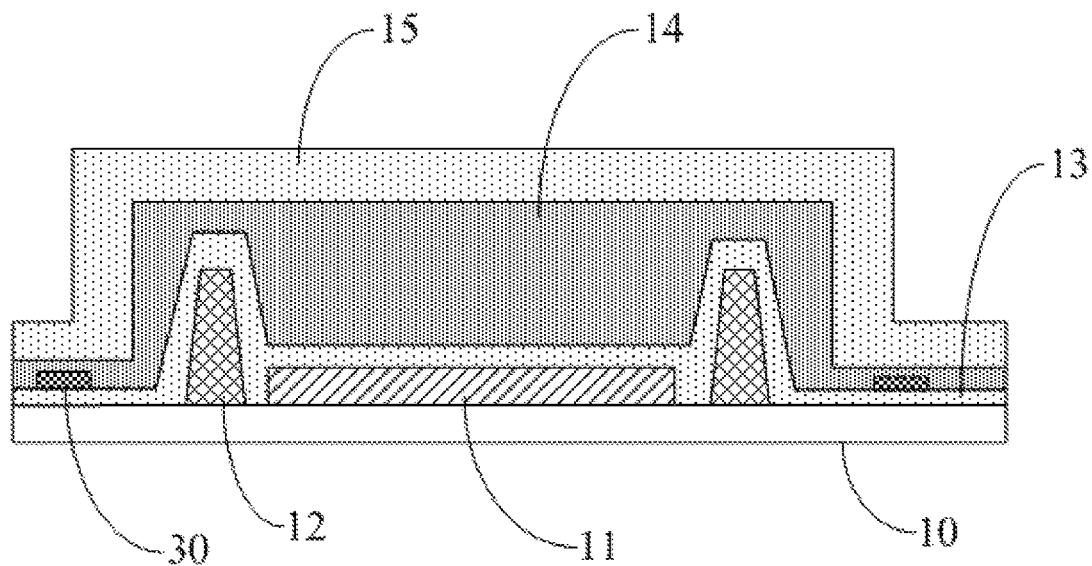
FIG. 4 is a schematic diagram when an organic thin film encapsulation layer overflows a barrier layer in an organic light emission display device provided by an embodiment of the present disclosure.

As shown in FIG. 4, for example, before the organic thin film encapsulation layer 14 is not cured, the colloidal organic thin film encapsulation layer 14 overflows the barrier layer 12. In the case that the organic thin film encapsulation layer 14 overflows the barrier layer 12, the overflowed organic thin film encapsulation layer 14 makes contact with the detection layer 30, and once the contact occurs, the detection layer 30 makes the color change; since the first inorganic thin film encapsulation layer 13, the organic thin film encapsulation layer 14 and the second inorganic thin film encapsulation layer 15 are all colorless and transparent, an observer can directly observe the color change with naked eyes, thereby simplifying the detection process, reducing a production cost and improving a product yield.

For example, the organic light emission display device according to the embodiments of the present disclosure is display devices such as an OLED panel, an OLED display, an OLED television or an electronic paper, etc.

Figure 5:
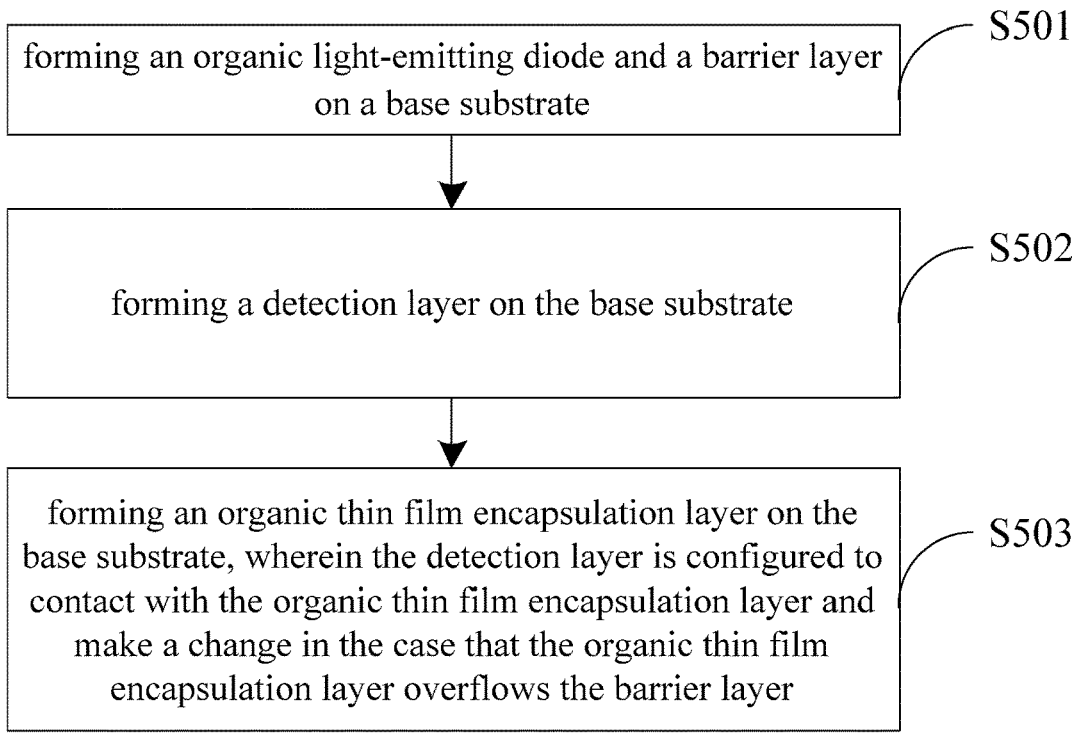
FIG. 5 is a flowchart of an encapsulation method for an organic light emission display device provided by an embodiment of the present disclosure.

As shown in FIG. 5, the embodiments of the present disclosure further provide an encapsulation method for an organic light emission display device, and the method comprises:

S501: forming an organic light emission diode and a barrier layer on a base substrate;

S502: forming a detection layer on the base substrate; and

S503: forming an organic thin film encapsulation layer on the base substrate;

For example, the detection layer is configured to contact with the organic thin film encapsulation layer and make a change in the case that the organic thin film encapsulation layer overflows the barrier layer.

Hereinafter, the encapsulation method for the organic light emission display device provided by the embodiments of the present disclosure is described in detail in combination with FIGS. 6 to 8.

Figure 6:
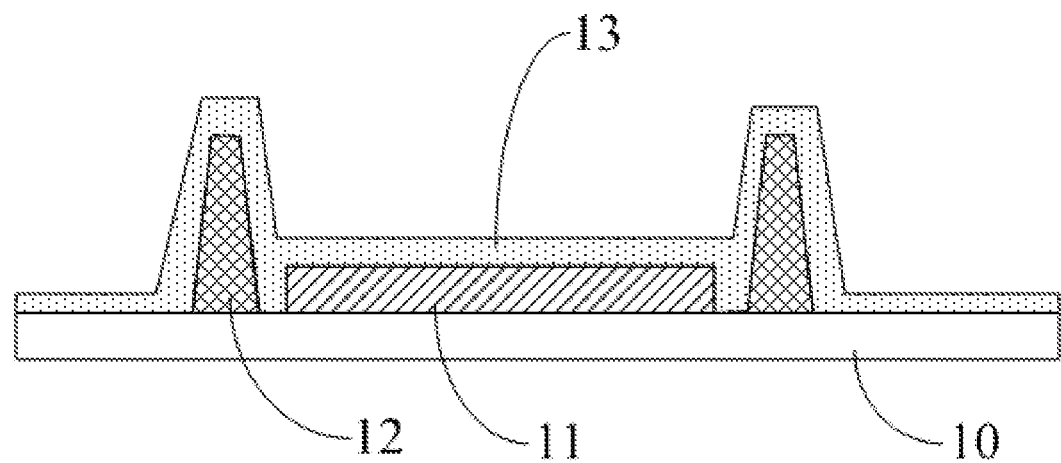
FIGS. 6-8 are structural diagrams of different stages of the encapsulation method for an organic light emission display device provided by the embodiment of the present disclosure.

As shown in FIG. 6, the organic light emission diode 11 and the barrier layer 12 are formed on the base substrate 10. For example, the organic light emission diode 11 and the barrier layer 12 are respectively formed by adopting a patterning process. Afterwards, the first inorganic thin film encapsulation layer 13 covering an entirety of the base substrate 10 is manufactured on the base substrate 10.

Figure 7:
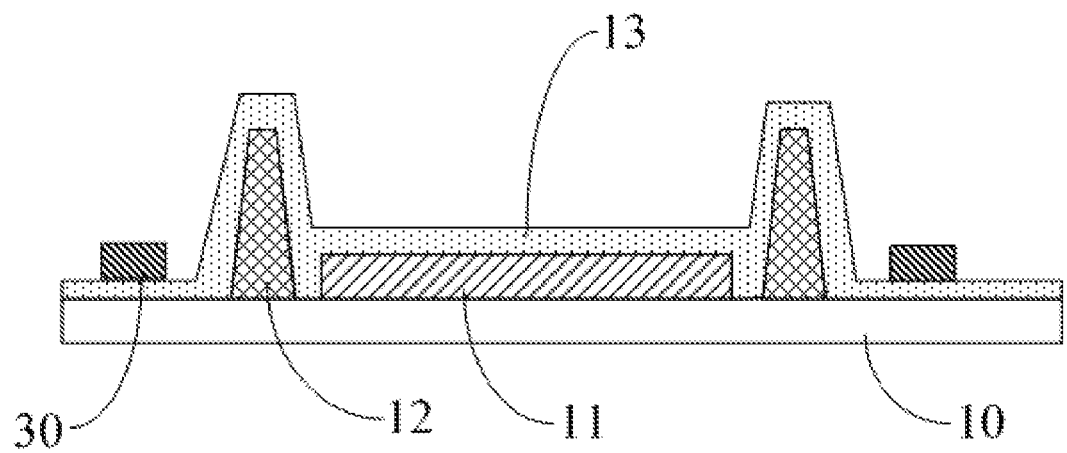

As shown in FIG. 7, the detection layer 30 is formed on the base substrate 10, for example, the detection layer 30 surrounds the barrier layer 12. For example, the detection layer 30 is formed on the base substrate 10 by a coating method. For example, the detection layer 30 is a layer which makes a color change once it contacts with the organic thin film encapsulation layer 14; and for example, according to the embodiments of the present disclosure, a $FeCl_3$ layer is formed on the base substrate 10 by the coating method to serve as the detection layer 30.

Figure 8:
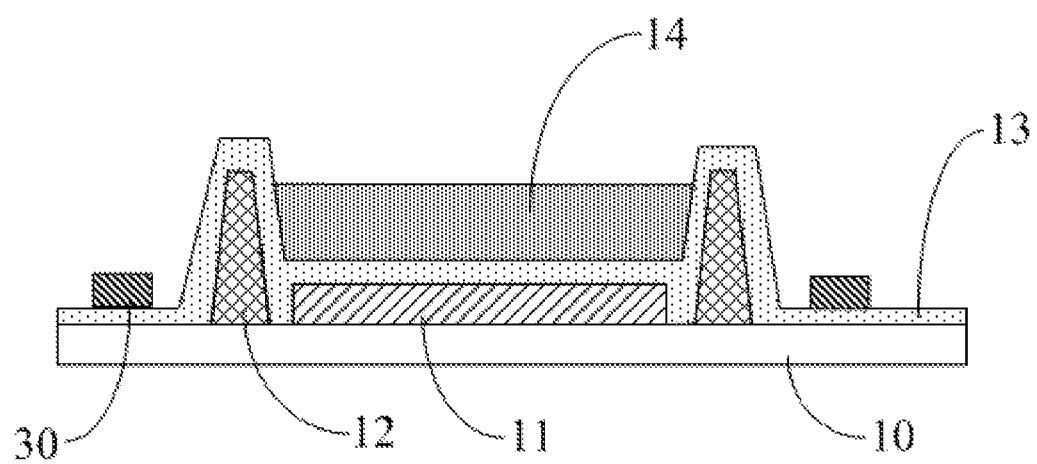

As shown in FIG. 8, the organic thin film encapsulation layer 14 is formed to cover the organic light emission diode 11. For example, the organic thin film encapsulation layer 14 is located in a region surrounded by the barrier layer 12, and a side surface of the organic thin film encapsulation layer 14 is contact with the barrier layer 12. In some cases, the process for forming the organic thin film encapsulation layer 14 is abnormal and the organic thin film encapsulation layer 14 overflows the barrier layer 12, at this point, the organic thin film encapsulation layer 14 makes contact with the detection layer 30 so that the detection layer 30 makes the color change, and therefore, the observer directly observes the process fault with naked eyes. In some cases, the process for forming the organic thin film encapsulation layer 14 is normal and the organic thin film encapsulation layer 14 does not overflow the barrier layer 12 and does not make contact with the detection layer 30, and thus the detection layer 30 does not make the color change.

Finally, the second inorganic thin film encapsulation layer 15 covering the the entirety of the base substrate 10 is formed on the organic thin film encapsulation layer 14, referring to FIG. 3. The detection layer 30 in the embodiments of the present disclosure is sealed between the first inorganic thin film encapsulation layer 13 and the second inorganic thin film encapsulation layer 15 and is not exposed outside the first inorganic thin film encapsulation layer 13 and the second inorganic thin film encapsulation layer 15. For example, the detection layer 30 is not exposed in the air. Therefore, the formation of the detection layer 30 does not affect the encapsulation effect of the organic light emission display device.

The embodiments of the present disclosure provide the organic light emission display device, the organic light emission display device comprises the base substrate, and the organic light emission diode, the barrier layer and the organic thin film encapsulation layer which are disposed on the base substrate, the organic light emission display device further comprises the detection layer disposed on the base substrate, and the detection layer is configured to contact with the organic thin film encapsulation layer and make the change in the case that the organic thin film encapsulation layer overflows the barrier layer. According to the embodiments of the present disclosure, the detection layer is disposed on the base substrate, and such detection layer is configured to contact with the organic thin film encapsulation layer and make the change in the case that the organic thin film encapsulation layer overflows the barrier layer. Therefore, the detection layer in the embodiments of the present disclosure detects whether the organic thin film encapsulation layer overflows the barrier layer or not, and compared with a situation that whether the organic thin film encapsulation layer overflows the barrier layer or not cannot be detected, the embodiments of the present disclosure simplifies the detection process, reduces the production cost and improve the product yield.

The foregoing embodiments merely are exemplary embodiments of the disclosure, and not intended to define the scope of the disclosure, and the scope of the disclosure is determined by the appended claims.

The application claims priority of Chinese Patent Application No. 201610491246.2 filed on Jun. 28, 2016, the disclosure of which is incorporated herein by reference in its entirety as part of the present application.

The invention claimed is:

1. An organic light emission display device, comprising a base substrate, and an organic light emission diode, a barrier layer and an organic thin film encapsulation layer which are disposed on the base substrate, wherein
the organic thin film encapsulation layer covers the organic light emission diode;
the organic light emission display device further comprises a detection layer disposed on the base substrate;
the organic light emission diode is provided within a region surrounded by the barrier layer, the detection layer is provided outside the region surrounded by the barrier layer, and the organic light emission diode does not overlap the detection layer in a direction perpendicular to an upper surface of the base substrate; and
the detection layer is configured to make a change if the organic thin film encapsulation layer overflows the barrier layer and contacts with the detection layer.

2. The organic light emission display device according to claim 1, wherein the detection layer is a layer which makes a visible change once it contacts with the organic thin film encapsulation layer.

3. The organic light emission display device according to claim 2, wherein the detection layer is a layer which makes a color change once it contacts with the organic thin film encapsulation layer.

4. The organic light emission display device according to claim 3, wherein a material of the detection layer is ferric chloride.

5. The organic light emission display device according to claim 1, further comprising a first inorganic thin film encapsulation layer located between the organic thin film encapsulation layer and the organic light emission diode and a second inorganic thin film encapsulation layer located on a side of the organic thin film encapsulation layer facing away from the organic light emission diode, wherein
the detection layer is located between the first inorganic thin film encapsulation layer and the second inorganic thin film encapsulation layer.

6. The organic light emission display device according to claim 1, wherein the detection layer is directly located on the base substrate.

7. The organic light emission display device according to claim 1, wherein
the detection layer is independent from the organic light emission diode and is disposed on a side of the barrier layer away from the organic light emission diode; and
the detection layer is disposed to be a continuous or discontinuous layer.

8. The organic light emission display device according to claim 1, comprising a display region and a non-display region surrounding the display region, wherein
the organic light emission diode is disposed in the display region, and the barrier layer and detection layer are disposed in the non-display region.

9. The organic light emission display device according to claim 1, wherein the base substrate is a glass substrate or flexible substrate.

10. The organic light emission display device according to claim 5, wherein the detection layer is sealed between the first inorganic thin film encapsulation layer and the second inorganic thin film encapsulation layer and is not exposed outside the first inorganic thin film encapsulation layer and the second inorganic thin film encapsulation layer.

11. An encapsulation method for an organic light emission display device, comprising:
forming an organic light emission diode and a barrier layer on a base substrate;
forming a detection layer on the base substrate; and
forming an organic thin film encapsulation layer on the base substrate, wherein the organic thin film encapsulation layer covers the organic light emission diode; the organic light emission diode is provided within a region surrounded by the barrier layer, the detection layer is provided outside the region surrounded by the barrier layer, and the organic light emission diode does not overlap the detection layer in a direction perpendicular to an upper surface of the base substrate; and the detection layer is configured to make a change if the organic thin film encapsulation layer overflows the barrier layer and contacts with the detection layer.

12. The method according to claim 11, wherein the forming the detection layer on the base substrate includes:
    forming the detection layer on the base substrate by a coating method.

13. The method according to claim 11, wherein before forming the detection layer on the base substrate, the method further comprises:
    forming a first inorganic thin film encapsulation layer covering an entirety of the base substrate on the base substrate.

14. The method according to claim 11, wherein after forming the organic thin film encapsulation layer on the base substrate, the method further comprises:
    forming a second inorganic thin film encapsulation layer covering an entirety of the base substrate on the organic thin film encapsulation layer.

15. The method according to claim 11, wherein the detection layer is a layer which makes a visible change once it contacts with the organic thin film encapsulation layer.

16. The method according to claim 15, wherein the detection layer is a layer which makes a color change once it contacts with the organic thin film encapsulation layer.

17. The method according to claim 16, wherein a material of the detection layer is ferric chloride.

18. The method according to claim 11, wherein, the detection layer is directly located on the base substrate.

19. The method according to claim 11, wherein
    the detection layer is independent from the organic light emission diode and is disposed on a side of the barrier layer away from the organic light emission diode; and
    the detection layer is disposed to be a continuous or discontinuous layer.

20. The method according to claim 11, wherein the organic light emission display device comprises a display region and a non-display region surrounding the display region, the organic light emission diode is disposed in the display region, and the barrier layer and detection layer are disposed in the non-display region.

* * * * *